United States Patent [19]

Pichel et al.

[11] Patent Number: 4,823,735

[45] Date of Patent: Apr. 25, 1989

[54] REFLECTOR APPARATUS FOR CHEMICAL VAPOR DEPOSITION REACTORS

[75] Inventors: Marlowe A. Pichel, Aguanga; James McDiarmid, San Jose; Glenn A. Pfefferkorn, San Jose; Roger P. Cory, San Jose, all of Calif.

[73] Assignee: Gemini Research, Inc., Fremont, Calif.

[21] Appl. No.: 48,716

[22] Filed: May 12, 1987

[51] Int. Cl.$^4$ ............................................. C23C 16/00
[52] U.S. Cl. .................................... 118/730; 118/64; 118/620; 118/641; 118/728

[58] Field of Search ............... 118/728, 730, 641, 620, 118/64

Primary Examiner—Bernard Pianalto
Attorney, Agent, or Firm—Townsend and Townsend

[57] ABSTRACT

A reflector apparatus with multiple reflecting facets for chemical vapor deposition reactors. For vertical and barrel reactors, the facets are annular and fit around the bell-jar shaped process enclosure. The facets may be adjusted by orienting or curving the reflecting facet surfaces so that the radiant energy from the reactor susceptor may be reflected back to the susceptor and wafers as desired for uniform heating of the processed semiconductor wafers.

32 Claims, 5 Drawing Sheets

REFLECTOR APPARATUS FOR CHEMICAL VAPOR DEPOSITION REACTORS

FIELD OF THE INVENTION

The present invention relates to a reflector apparatus for a reactor for depositing a layer of material onto a substrate, and more particularly, a reflector apparatus for a reactor for the epitaxial chemical vapor deposition of a material onto a single crystal substrate.

BACKGROUND OF THE INVENTION

Chemical vapor deposition (CVD) of a layer of material onto a substrate is a well-known, but often complex, art. One example of a substrate is a single crystal silicon slice, or wafer, used in the manufacture of semiconductor devices. Such wafers are typically 100-125 mm diameter and are expected to be produced in excess of 200 mm diameter in the future. These silicon wafers are approximately 0.5 mm thick. Heating such substrates rapidly to high chemical vapor deposition process temperatures (900-1300° C.) and cooling them to room temperature creates major technical problems for the semiconductor industry.

Material deposited on a single crystal wafer may be epitaxial (having the same crystal orientation as the wafer), polycrystalline (having many regions of different crystallographic orientations), or amorphous (having essentially no crystalline structure).

The invention described here applies to reactors specifically designed to deposit epitaxial silicon films on a single crystal silicon wafer; however, the invention also may be used for reactors to heat any thin, flat substrate to a high temperature for the purpose of depositing a single crystal, polycrystalline or amorphous film.

In the present art, wafers are placed on a carrier or susceptor which is heated to 900-1300° C. in a reactor. Process gases are continuously introduced into the reactor process enclosure or chamber to react on the heated susceptor and wafers for the deposition of material upon the wafers. The gaseous by-products are exhausted from the chamber. Process gases are then purged from the chamber, and the susceptor with wafers is cooled in order to remove the wafers.

A problem with CVD reactors is the undersirable crystal defects which can occur in both the silicon wafer and the deposited epitaxial silicon layer. This is true especially for the larger substrates, 100 mm in diameter and larger. These defects are caused by induced thermal stress caused by temperature gradients in the wafer. The gradients are, in turn, caused by nonuniform heating of the wafers.

To solve this problem of nonuniform heating, various types of heating methods have been used. Three methods of heating have been used individually or in combinations to heat the susceptor in the reactor: (1) induction heating with the coils inside and/or outside the process chamber; (2) resistance heating with the heater elements inside and/or outside the chamber; and (3) radiant heating by infrared lamps placed outside the chamber. Sometimes these methods were combined with reflective shrouds placed on the process chamber walls or on the outside of the process chamber.

These heating methods have met with varying degrees of success but reduction, and possibly complete elimination, of slip remains a constant goal.

Another problem faced by all reactors is the maintenance of the process chamber walls at substantially lower temperatures than the heated susceptor to minimize deposits on the chamber walls. These deposits on the process chamber walls are a problem because they can flake off and contaminate the cleanliness of the substrates, which is vital in semiconductor manufacturing.

To cool the process chamber walls, present CVD reactor designs require elaborate cooling systems for the walls. Typically air is forced against the walls in a constant flow by a sequence of baffles and air pump(s).

The present invention avoids or substantially mitigates the problems above. Substrates are heated with minimum amounts of temperature gradients to avoid stress. Crystal slip and dislocations in the deposited layer and substrates are thus avoided. Additionally, the present invention provides for a solution to the problem of reactor wall cooling.

SUMMARY OF THE INVENTION

The present invention provides for a reflector unit which is placed about the process enclosure during operation of the reactor. The unit has a plurality of facets. By orienting and/or shaping the reflecting surface of each facet, the facets can heat the susceptor and wafers in a predetermined manner. For example, each facet can be adjusted so that as much radiant energy as possible emitted from the heated susceptor is reflected back to the susceptor and wafers in one reflection. Each facet can also be adjusted such that radiant energy emitted from the heated susceptor and wafers is reflected back to a predetermined portion of the susceptor and wafers on that portion of the susceptor in one reflection. In this manner the reflector unit can produce a marked reduction in the amount of slip formed in the wafers processed in the CVD reactor.

The reflector unit is particularly adapted to CVD reactors having a central axis. Typically the reactor has a susceptor rotating about this central axis during operation and the process enclosure is a quartz bell jar. For these reactors, the reflector unit has annular facets around the process enclosure and centered on the central axis.

The reflector unit also has the additional advantage in that the cooling requirements for the walls of the CVD reactor are considerably reduced. This configuration makes the design of the cooling equipment for the reactor much easier and more economical.

BRIEF DESCRIPTION OF THE DRAWINGS

FIG. 1 is a cross-sectional side view of a vertical chemical vapor deposition reactor found in the prior art.

DETAILED DESCRIPTION OF THE PREFERRED EMBODIMENTS

Figure 1:
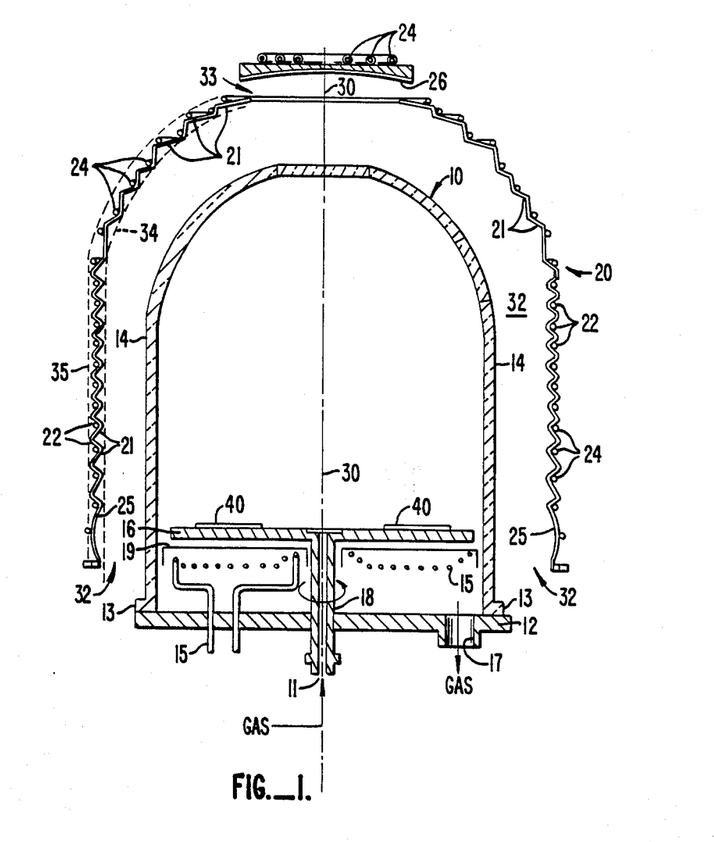
FIG. 1 also shows a cross-sectional side view of a reflector unit of the present invention in place over the vertical chemical vapor deposition reactor.

FIG. 1 shows a typical vertical CVD reactor 10 to which the present invention is particularly adapted. The reactor has a seal plate 12 which supports a flat, disk-shaped susceptor 16 on a pedestal 18 rotating about a center axis 30. The process gases enter the system through an inlet port 11 from a control console (not shown) and exits from one or more exhaust ports 17. The process chamber is defined by the seal plate 12 and a removable quartz vessel in the shape of bell jar 14 with a remakeable seal 13. The quartz bell jar 14 is closed at its open end by the seal plate 12 during operation. The process chamber formed by the seal plate 12 and bell jar 14 may be operated at pressures from below 1 torr to above 7600 torr (10 atmospheres) absolute pressure by suitable pumps (not shown).

The wafer substrates 40 are placed on the susceptor 16. Specially shaped cavities (not shown) in the susceptor 16 receive the wafers 40. These cavities are designed to minimize thermal gradients in the wafers 40 to reduce crystallographic slip which may be generated in the epitaxial layer deposited on the wafers placed in the reactor or in the wafer itself.

A coil 15 heats the susceptor 16 by resistance heating or by high frequency induction heating. A coil cover 19 protects and separates the coil 15 from the susceptor 16. The susceptor 16 may also be heated by radiant heating from infrared lamps (not shown) outside the walls of the bell jar 14. The lamps provide radiant energy which is transmitted through the quartz walls with minimum losses and is then absorbed by the susceptor 16 and the wafers 40.

If the coil 15 is an induction coil as shown in FIG. 1, the coil 15 may have channels for liquid, such as water, for cooling.

Appropriately located fans 31 or pumps, shown symbolically, cool portions of the system, particularly the walls of the bell jar 14. Cool walls prevent material intended for the substrates 40 from being deposited on the bell jar walls. Otherwise the material on the walls would continually build up until eventually flaking occurs. These flakes are undesirable because they contaminate the reactor system and wafers which must be kept as clean as possible.

FIG. 1 also shows the reflector unit 20 of the present invention which surrounds the bell jar 14 of the CVD reactor 10. The unit 20 has annular reflecting facets 21, 25 arranged horizontally (or perpendicular to the center axis 30) and a separate top facet 26. The facets 21, 25 are connected together in the general shape of the quartz bell jar 14. The reflector unit 20 is separated from the bell jar 14 by a gap 32. At the top the unit has an opening 33 over which the separate facet 26 is placed. Copper cooling coils 24 wrap around the outside of the unit 20. Water is pumped through the coils 24 to keep the unit 20 from overheating.

As explained below, the inner surfaces of these reflective annular facets 21, 25 are adjusted for the optimal effect in reducing slip. The facets 21, 25 are connected together by other annular facets 22 which may not be reflective. Together the facets 21, 22 and 25 form a unitary structure for the reflector unit 20.

The shape of the reflector unit 20 is determined by inner and outer envelopes 34, 35 of the unit. The inner envelope 34 defines the inner boundaries of the reflector unit 20. As shown in FIG. 1 the inner envelope 34 substantially parallels the surface of the quartz bell jar 14; the envelope is approximately one and a half inches from the bell jar 14. The separation between the CVD reactor 10 and reflector unit 20 is exaggerated in FIG. 1 to show their relationship with each other.

The outer envelope 35 of the reflector unit 20 also parallels the walls of the bell jar 14. It is designed so that the reflector unit 20 can be handled easily. In the loading and unloading of substrates 40 the reflector unit 20 must be opened with the bell jar 14 to permit access to the susceptor 16.

The annular facets 21, 25 and facet 26 are adjusted so that each facet reflects energy from the susceptor 16 back to the susceptor 16 and wafers 40 as desired. Unlike previous reflective shrouds which merely randomly reflected energy back into the reactor system, the reflector unit 20 of the present invention allows energy to be reflected back to the susceptor 16 and wafers 40 in a calculated manner. Each facet 21, 25 and 26 can be independently shaped and independently oriented as desired.

Figure 2:
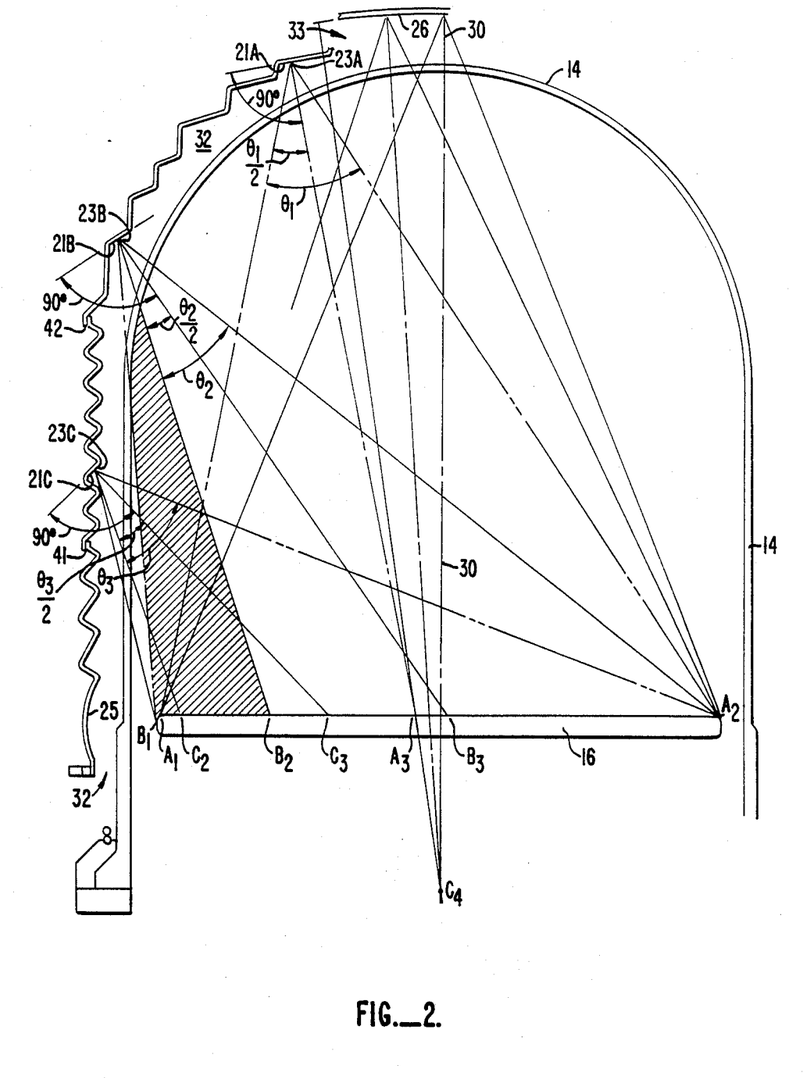
FIG. 2 details in a cross-sectional view the geometrical relationship of one embodiment of the reflector unit with respect to the susceptor of the CVD reactor.

One embodiment of the present invention is detailed in FIG. 2. Each of the reflecting facets 21 and connecting facets 22 are flat, which makes the facets 21, 22 easier to manufacture than more complex shapes. Each facet 21 is oriented with respect to the susceptor 16 to return as much energy as possible to the susceptor 16 and wafers 40 in one reflection.

The arrangement or orientation of these facets is as follows. The annular facets 21 are defined within the inner and outer envelopes 34, 35 of the unit 20. Each facet 21 has a midpoint 23 in a cross-sectional view (as in FIG. 2). For each reflecting facet 21, energy from each point on the susceptor 16 is assumed to be radiated only toward the midpoint 23. The opposite end points on the susceptor 16 emitting energy capable of being reflected by the facet 21 back to the susceptor 16 define an angle $\theta$ with the midpoint 23. The angle $\theta$ is halved to define a bisecting line and the facet 21 is oriented perpendicularly to the bisecting line.

For example, in FIG. 2 the reflecting facet 21A near the top of the unit 20 has the midpoint 23A. (In passing, it should be mentioned that the location of midpoint 23A is correct. What appears to be three large annular facets 21 at the top of the reflector unit 20 in FIG. 2 are actually six facets. Each large facet is actually two annular facets 21 oriented slightly differently from each other.) The susceptor 16 has the end points $A_1$, $A_2$ for the facet 21A. The points $A_1$-23A-$A_2$ form the angle $\theta_1$. The angle is halved by bisecting line 23A-$A_3$ and the reflecting facet 21A is arranged so that it is perpendicular to the bisecting line 23A-$A_3$.

Each of the annular facets 21 is oriented in this manner. For some facets 21 not all of the points on the susceptor 16 are capable of emitting energy which can reach the midpoint 23. The energy from these points of the susceptor impinges the inner surface of the bell jar 14 at too large an angle from the normal to permit much, if any, transmission through the bell jar 14.

The facet 21B in FIG. 2 illustrates this point. For purposes of simplification energy rays impinging upon the inner surfaces of the quartz bell jar 16 at angles greater than 70 degrees from the normal are considered not capable of reaching the midpoint 23B. This simplification is made by examining the amount of infrared energy transmission through quartz at different angles of incidence. At angles greater than 70 degrees, the amount of transmitted energy is assumed to be insignificant to have much of an effect. Therefore, the energy emitted from points $B_1$ to $B_2$ cannot reach midpoint 23B. To make this point the area inside the bell jar 14 between the angle formed by $B_1$ and $B_2$ is shaded. Only rays from the susceptor points between $B_2$ and $A_2$ are capable of reaching the midpoint 23B. Thus the angle subtended by $B_2$-23B-$A_2$ forms the angle $\theta_2$. This angle $\theta$ is halved for bisecting line 23B-$B_3$ and the annular facet 23B is oriented perpendicular to this line.

Similarly for the facet 21C, only the rays from the susceptor points between $C_2$ and $A_2$ can reach the midpoint 23C. Thus the angle $\theta$ is defined by points $C_2$-23C-$A_2$.

The reflector unit 20 of FIG. 2 has two reflecting facets 25, 26 which are not flat reflecting surfaces. The annular facet 25 is located directly opposite the edges of the susceptor 16. The facet 25 has a circular cross-section with a center of the radius of curvature located within the susceptor 16 so that any ray perpendicular to the edge of the susceptor 16 is reflected back to the same susceptor point.

The facet 26, on the other hand, forms a reflecting cap at the top of the reflector unit 20. It is separated from the rest of the unit 20 and placed over the aperture 33 at the unit top $30\frac{1}{2}$ inches above the top surface of the susceptor 16. The facet 26 is a spherical reflecting surface (a circular reflecting surface in cross-section) having a radius of curvature of some 36 inches with a center point $C_4$ of the radius of curvature located along the center axis 30. With this curvature any ray from the $23\frac{1}{2}$ inch-diameter susceptor 16 will be reflected by the facet 26 back to some other point of the susceptor 16.

The orientation of all these facets 21, 25 and 26 reflects as much radiant energy emitted by the heated susceptor 16 as possible back to the susceptor 16 in one reflection. For the best uniform heating of the substrates 40, the reflector unit 20 is accounted for by fine tuning the heights of the heating coils 15 to the susceptor 16 above.

It has been found that the reflector unit 20 has a remarkable effect on the reduction of slip. In vertical CVD reactors without the unit 20 the particular shape of the cavities in the susceptor 16 holding the substrates 40 has a strong effect on slip reduction. It is known that the cavity shape strongly influences whether the heating of the substrates 40 occurs uniformly or not. With the reflector unit 20 this dependency on cavity shape is markedly reduced. Thus the reflector unit 20 makes a large contribution toward uniform heating of the substrates 40 and slip reduction.

The inner surfaces of the reflector unit 20 towards the susceptor 16 are polished and plated to best reflect the radiant energy from the susceptor 16 and wafers 40. As drawn in FIG. 2 the reflector unit 20 can be manufactured in four parts: the separate top spherical cap with the facet 26, and three assembled parts connected at points 41, 42. The flat surfaces for the reflecting facets 21 and connecting facets 22 make the reflector unit 20 more economical to manufacture.

Whatever technique is used, the reflector unit 20 has an additional advantage over the previous CVD reactors. The unit 20 permits the walls of the bell jar 14 to be cooled very easily. The heat from the reactor 10 heats the air in the gap 32. By a chimney effect air is pumped into the gap 32 at the bottom of the unit 20 and released through the aperture 33 at the top. In effect the combination of the reactor 10 and the reflector unit 20 acts as an air pump and the requirements for air pumps to cool the system is considerably reduced.

The distance of approximately one and a half inches between the reflector unit 20 and the bell jar 14 is such that the inner envelope 34 is removed from the bell jar 14 sufficiently to permit a sufficient quantity of air to be drawn through the gap 32 to cool the walls of the bell jar 14. On the other hand, the inner envelope 34 is close enough so that the air flow across the zig-zag surface of the unit 20 disrupts any laminar flow to some degree along the outer wall surface of the bell jar 14. This more turbulent flow permits a large percentage of the air admitted through the gap 32 to effectively cool the bell jar walls and considerably reduces the requirements for air pumps.

Still another advantage of the reflector unit 20 is that of a safety shield around the CVD reactor 10. These bell jars 14 have been known to explode or burst; the unit 20 can reduce damage to the reactor enclosure and to the operators in the vicinity.

Because the facets 21, 25 and 26 may be adjusted as desired, the facets may be arranged to reflect radiant energy back to particular parts of the susceptor and wafers. One alternative arrangement is to orient the facets 21, 25 and 26 so that most of the reflected energy is directed toward the outside of the susceptor 16 where most of the energy is lost by radiation. The position of the heating coils 15 may then be adjusted for optimal uniform heating of substrates 40.

Another embodiment is to curve the surfaces of the annular facets 21. From the previous description of the orientation of the facets 21 in FIG. 2 it is clear that the assumption that the energy rays from the susceptor 16 only strike the midpoint 23 of a facet 21 is an approximation. The surface of each facet 21 can be curved in a concave fashion such that any line perpendicular to the surface of the facet 21 intersects the point defined by the intersection of the bisecting line and the surface of the susceptor 16. These points were $A_3$, $B_3$ and $C_3$ for the exemplary facets 21A-C for FIG. 2. Of course, other curvatures may be used for the facets 21, 25 and 26 to suit the needs of the particular system.

The reflector unit 20 may also be combined with heat lamps. For example, one possibility is a reflector unit and a combination of lamp (s) substituted for the top facet 26. Additional energy is then available to heat the substrates 40. Other combinations place lamps and reflectors in openings where the annular facets 21, 22 and 25 are. All these combinations may be used to ensure that the substrates are heated uniformly in the reactor 10.

Figure 3A:
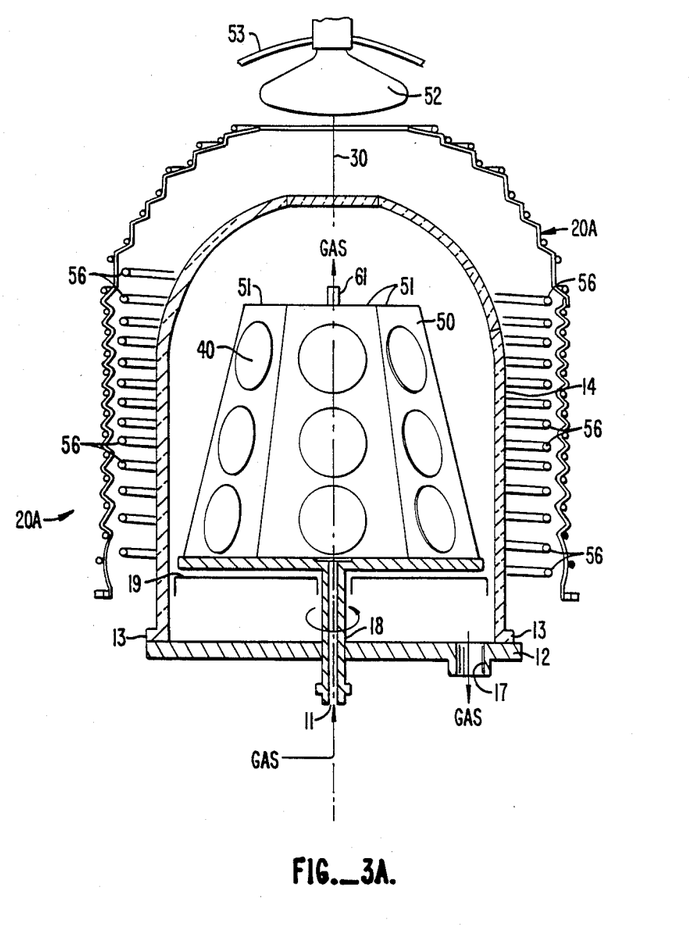
FIG. 3A is a cross-sectional view of a barrel-type CVD reactor with a reflector unit of the present invention and a lamp at the top of the reflector unit.

Furthermore, the reflector unit of the present invention need not be limited to vertical reactors shown in FIGS. 1 and 2. FIG. 3A illustrates a barrel reactor having a susceptor 50 for holding wafers 40. The barrel-shaped susceptor 50 is heated by induction coils, which may be located outside of the bell jar enclosure 14 or inside the susceptor 50. In FIG. 3A the induction coils 56 are shown on the outside. Typically, if the coils are placed inside the susceptor 50, these costs are enclosed by an internal bell jar to isolate the internal coils from the process chamber.

Figure 3B:
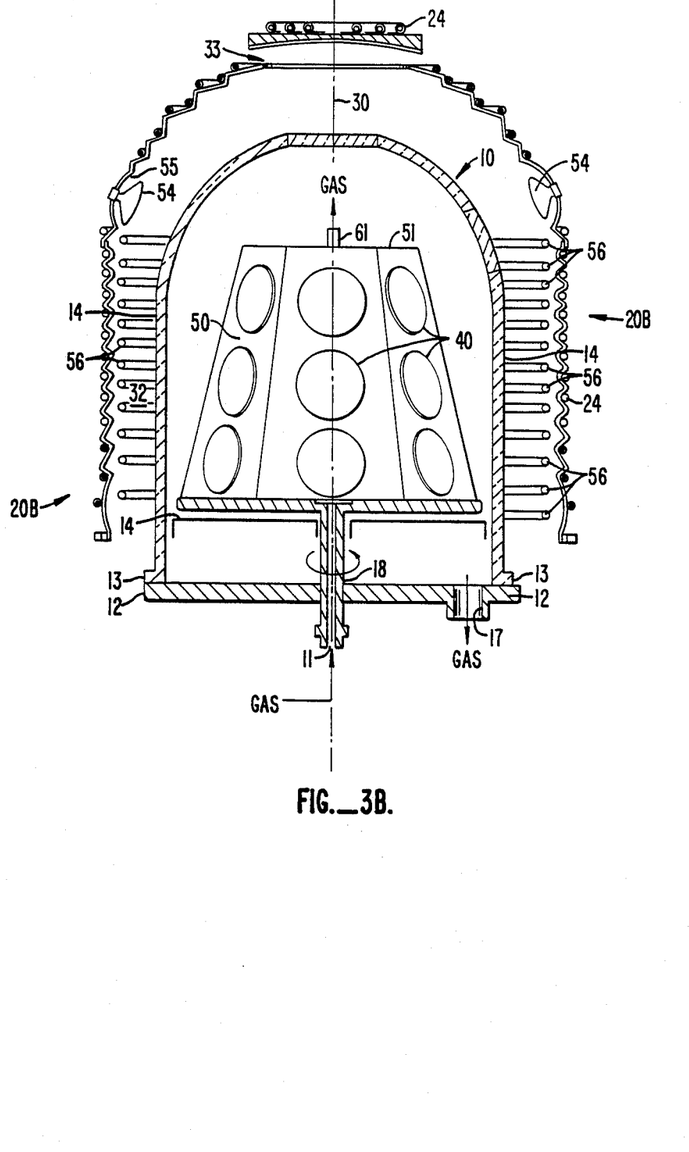
in FIG. 3B lamps are placed near the top edge of the barrel susceptor.

Gas is introduced into the process chamber by an inlet port 61 in the form of a long tube on the center axis 30 of the reactor. The annular reflecting facets of the reflector unit 20A can be designed so that the energy can be directed toward predetermined portions of the susceptor 50. Since the susceptor 50 loses most of its heat by radiation through the susceptor edge 51, the annular facets can be adjusted by curving and/or orienting the facet surfaces to reflect most of the radiant energy from the susceptor 50 back toward the edge 51. FIG. 3A also shows a lamp 52 which can be focused by a reflector 53 to direct the lamp's energy toward the edge 51. Other configurations may locate lamps in the reflector unit near the susceptor edge 51. Such an arrangement is shown in FIG. 3B. The lamps 54 (with focusing reflectors 55) are placed around the bell jar 14 to put more energy back to the edge 51 than the operation of the reflector unit 20B alone.

Figure 3C:
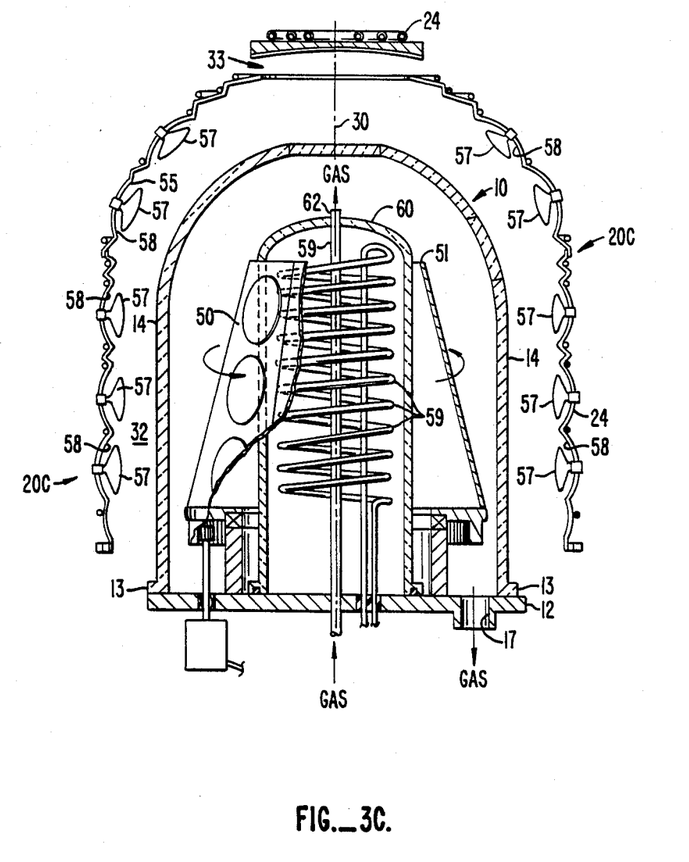
FIG. 3C has lamps along the entire length of the barrel susceptor.

FIG. 3C illustrates another arrangement with multiple lamps 57, their associated reflectors 58 and a reflector unit 20C. In this case the lamps 57 are placed around the bell jar 14 and along the length of the susceptor 50. The lamps can be operated as the sole source of energy or combined in complementary fashion with internal induction coils 59 isolated by an internal bell jar 60, as shown in FIG. 3C. A gas inlet port 62 in the form of a long tube is connected to a gas source (not shown) at one end. The tube 62 is on the center axis of the system 30 and passes through the inner bell jar 60 to introduce gas into the process chamber at the tube's other end. With the internal coils 59 and internal bell jar 60, a cylindrical pedestal 61 is used to rotate the susceptor 50. The particular arrangements for such a barrel reactor system are well known to those experienced in the design of CVD reactors. Whatever the energy source arrangement selected, the reflector unit 20C may be modified as discussed previously to ensure a uniform heating of the wafers 40.

It should be noted that when lamps are combined with the bell jar-shaped portion of the reflector unit, the lamps (and focusing reflectors for the lamps) should be integrated into the reflector unit of the present invention. This integration into a unitary structure allows the assembly to operate as previously explained for an effective cooling of the quartz walls of the process enclosure.

Thus far the present invention has been explained with respect to CVD reactors having radial symmetry. The reactor has a central axis about which a susceptor rotates; the process enclosure is accordingly radially symmetrical. With adjustments to the annular reflecting facets, as explained previously, radiant energy can be reflected back anywhere along the central axis, thus permitting the reflected energy to be directed to any portion of the susceptor whether oriented perpendicularly to the central axis, such as a flat, disk-shaped susceptor (FIGS. 1 and 2), or oriented parallel to the central axis, such as a barrel susceptor (FIGS. 3A, 3B and 3C).

The adjustable reflecting facets of the present invention may be used in nonradially symmetric reactors, such as horizontal CVD reactors. For example, the facets could be arranged horizontally along the length of the susceptor and adjusted to reflect the radiation from the susceptor and wafers back to the edges of the susceptor where much of the radiation loss occurs. Other arrangements are also possible.

Thus, while the invention has been particularly shown and described with reference to the preferred embodiments, it is understood by those skilled in the art that changes in form and details may be made without departing from the spirit of this invention. It is therefore intended that an exclusive right be granted to the invention as limited only by the metes and bounds of the claims.

What is claimed is:

1. In a chemical vapor deposition reactor having a susceptor for holding substrates, means for heating said susceptor and substrates and an enclosure around said susceptor, said enclosure substantially transparent to radiant energy from said susceptor and substrates during operation of said reactor,
a reflector unit surrounding said enclosure, said reflector comprising a plurality of facets, each facet adjusted with respect to said susceptor such that radiant energy from said susceptor and substrates, is reflected by each facet back to said susceptor and substrate in a predetermined manner.

2. The chemical vapor deposition reactor of claim 1 wherein said reflector unit has at least one of said facets adjusted by orienting said facet with respect to said susceptor.

3. The chemical vapor deposition reactor of claim 1 wherein said reflector unit has at least one of said facets adjusted by shaping said facet with respect to said susceptor.

4. The chemical vapor deposition reactor of claim 1 wherein said reflector unit has a bell jar shape and is open at the top and bottom.

5. The chemical vapor deposition reactor of claim 4 wherein said facets of said reflector unit are annular.

6. In a chemical vapor deposition reactor having a susceptor for holding semiconductor wafers, said susceptor rotating about a center axis during operation, and a process enclosure around said susceptor and said center axis, a reflector unit comprising:
a plurality of reflecting annular facets, each annular facet disposed perpendicularly to said center axis and connected together into a unitary structure around said process enclosure, a surface of each annular facet oriented with respect to said susceptor to reflect the maximum amount of radiant energy emitted from said susceptor and wafers during operation back to said susceptor and wafers in one reflection.

7. The chemical vapor deposition reactor as in claim 6 wherein said process enclosure is in the shape of a bell jar and said unitary structure of said annular facets substantially parallels said process enclosure.

8. The chemical vapor deposition reactor as in claim 7 wherein said unitary structure has a bottom and top, said bottom and top being open.

9. The chemical vapor deposition reactor as in claim 8 further comprising a separate reflecting facet disposed above said top of said unitary structure, said separate facet having a spherical concave shape.

10. The chemical vapor deposition reactor as in claim 8 wherein said susceptor is substantially a flat disk with a circumferential edge, said disk perpendicular to said central axis, and wherein said reflector unit has an annular reflecting surface disposed opposite said disk edge across said enclosure.

11. The chemical vapor deposition reactor as in claim 10 wherein said annular reflecting surface is curved with a center of radius within said susceptor edge whereby energy radiated from said edge toward said annular reflecting surface is reflected back to said edge.

12. The chemical vapor deposition reactor as in claim 7 wherein said reflecting surface of at least one annular facet is flat in cross-section.

13. In a chemical vapor deposition reactor having a susceptor for holding semiconductor wafers, said susceptor rotating about a center axis during operation, and a process enclosure around said susceptor and said center axis, a reflector unit comprising:
- a plurality of reflecting annular facets, each of said facets disposed perpendicularly to said center axis and connected together into a unitary structure around said process enclosure, a surface of each annular facet oriented with respect to said susceptor to reflect the radiant energy emitted from said susceptor and wafers during operation back to a predetermined portion of said susceptor and wafers in one reflection.

14. The chemical vapor deposition reactor as in claim 13 wherein said process enclosure is in the shape of a bell jar and said unitary structure of said annular facets substantially parallels said process enclosure.

15. The chemical vapor deposition reactor as in claim 14 wherein said unitary structure has a bottom and top, said bottom and top being open.

16. The chemical vapor deposition reactor as in claim 15 further comprising a separate reflecting facet disposed above said top of said unitary structure, said separate facet having a spherical concave shape.

17. The chemical vapor deposition reactor as in claim 15 wherein said susceptor is substantially a flat disk with a circumferential edge, said disk perpendicular to said central axis, and wherein said reflector unit has an annular reflecting surface disposed opposite said disk edge across said enclosure.

18. The chemical vapor deposition reactor as in claim 17 wherein said annular reflecting surface is curved with a center of radius within said susceptor edge whereby energy radiated from said edge toward said annular reflecting surface is reflected back to said edge.

19. The chemical vapor deposition reactor as in claim 13 wherein the reflecting surface of at least one annular facet is flat in cross-section.

20. In a chemical vapor deposition reactor having a susceptor for holding semiconductor wafers rotatable about a central axis, a process enclosure surrounding said susceptor and wafers during operation of said reactor, said enclosure transparent to energy radiated by said susceptor and wafers during operation, a reflector unit surrounding said process enclosure, said reflector unit comprising
- a plurality of annular reflecting surfaces, each annular reflecting surface disposed symmetrically about said central axis, each surface in a cross-sectional view along said central axis adjustable so that energy radiated from said susceptor and wafers is reflected in one reflection back to said susceptor and wafers along said central axis in a predetermined manner.

21. The chemical vapor deposition reactor as in claim 20 wherein at least one reflecting surface of said reflector unit is adjusted by curving said surface.

22. The chemical vapor deposition reactor as in claim 20 wherein at least one reflecting surface of said reflector unit is adjusted by orienting said surface with respect to said susceptor.

23. The chemical vapor deposition reactor as in claim 22 wherein said one reflecting surface is further adjusted by curving said surface.

24. The chemical vapor deposition reactor as in claim 20 wherein said annular reflecting surfaces of said reflector unit form a unitary structure and define an inner envelope around said process enclosure, said inner envelope displaced from said process enclosure such that cooling gas can be drawn into the separation between the process enclosure and said annular reflecting surfaces.

25. The chemical vapor deposition reactor as in claim 20 wherein said susceptor is substantially a flat disk with a circumferential edge, said disk perpendicular to said central axis, and wherein said reflector unit has an annular reflecting surface disposed opposite said disk edge across said enclosure.

26. The chemical vapor deposition reactor as in claim 25 wherein said annular reflecting surface is curved with a center of radius within said susceptor edge wherein energy radiated from said edge toward said annular reflecting surface is reflected back to said edge.

27. The chemical vapor deposition reactor as in claim 20 wherein most of said annular reflecting surfaces of said reflector unit are flat cross-section and oriented to reflect the maximum amount of energy back to said susceptor in one reflection.

28. The chemical vapor deposition reactor as in claim 27 wherein said process enclosure is in the form of a bell jar and wherein said reflector unit further comprises a reflecting surface over the top of said bell jar.

29. The chemical vapor deposition reactor as in claim 28 wherein said reflecting surface has a spherical concave shape.

30. The chemical vapor deposition reactor as in claim 20 wherein most of said annular reflecting surfaces of said reflector unit are flat in cross-section and oriented to reflect energy radiated from said susceptor back to the edges of said susceptor in one reflection.

31. The chemical vapor deposition reactor as in claim 30 wherein said process enclosure is in the form of a bell jar and wherein said reflector unit further comprises a reflecting surface over the top of said bell jar.

32. The chemical vapor deposition reactor as in claim 31 wherein said reflecting surface has a spherical concave shape.

* * * * *